US008629698B2

(12) United States Patent
Ueda

(10) Patent No.: US 8,629,698 B2
(45) Date of Patent: Jan. 14, 2014

(54) MIXING CIRCUIT

(75) Inventor: Yosuke Ueda, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 13/510,027

(22) PCT Filed: Nov. 7, 2011

(86) PCT No.: PCT/JP2011/006213
§ 371 (c)(1),
(2), (4) Date: May 16, 2012

(87) PCT Pub. No.: WO2012/063462
PCT Pub. Date: May 18, 2012

(65) Prior Publication Data
US 2012/0229177 A1 Sep. 13, 2012

(30) Foreign Application Priority Data
Nov. 12, 2010 (JP) ................................. 2010-253751

(51) Int. Cl.
*H03B 19/06* (2006.01)
(52) U.S. Cl.
USPC ........... 327/118; 327/116; 327/119; 327/356; 455/326; 455/330; 455/333
(58) Field of Classification Search
USPC ................. 327/113, 114, 116, 118–120, 356; 455/326, 330, 333
See application file for complete search history.

(56) References Cited

U.S. PATENT DOCUMENTS

| 6,057,714 A | * | 5/2000 | Andrys et al. ................. 327/105 |
| 6,242,963 B1 | | 6/2001 | Su et al. |
| 6,335,651 B1 | * | 1/2002 | Fayyaz ........................... 327/359 |
| 6,429,721 B1 | | 8/2002 | Armitage et al. |
| 6,982,588 B1 | * | 1/2006 | Lin et al. ...................... 327/359 |
| 2003/0098744 A1 | | 5/2003 | Banba |
| 2005/0280462 A1 | * | 12/2005 | Lin et al. ...................... 327/359 |

FOREIGN PATENT DOCUMENTS

| JP | 2003-168937 | 6/2003 |
| JP | 2007-013560 | 1/2007 |

OTHER PUBLICATIONS

Blaakmeer et al., "The Blixer, a Wideband Balun-LNA-I/Q-Mixer Topology", IEEE Journal of Solid-State Circuits, vol. 43, No. 12, pp. 2706-2715, Dec. 2008.

(Continued)

*Primary Examiner* — William Hernandez
(74) *Attorney, Agent, or Firm* — Morgan, Lewis & Bockius LLP

(57) ABSTRACT

There is provided a mixing circuit in which a rise of the consumption current can be suppressed while decreasing a non-linear component. The mixing circuit includes: an input unit 803 including a grounded-gate MOS transistor M1 with a source into which an input signal is input, and a grounded-source MOS transistor M2 with a gate into which the input signal is input; a frequency converter 802 for converting frequencies of a first current signal output from the grounded-gate MOS transistor M1 and a second current signal output from the grounded-source MOS transistor M2, and for generating a third current signal and a fourth current signal; a load MOS transistor M7, with a gate and a drain connected, for receiving a third current signal; and a load MOS transistor M8, with a gate and a drain connected, for receiving a fourth current signal.

7 Claims, 7 Drawing Sheets

(56) References Cited

OTHER PUBLICATIONS

International Preliminary Report on Patentability for corresponding application PCT/2011/006213, May 23, 2013.

EPO: Extended European Search Report for European Patent Application No. 11 839 988.0—Issued on Oct. 7, 2013.

JPO: Office Action for Japanese Patent Application No. 2012-523159—Issued on Sep. 10, 2013 (With English Translation of Notification of Grounds of Rejection).

* cited by examiner

F I G. 4
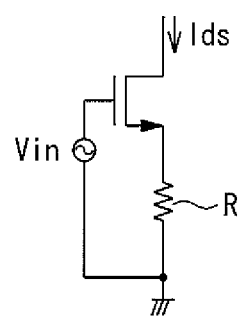

RELATED ART

F I G. 7
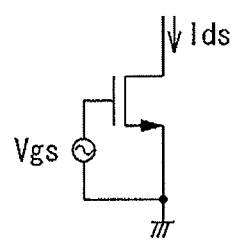

MIXING CIRCUIT

The present application is the national stage application of PCT/JP2011/006213, filed Nov. 7, 2011, which claims priority to Japanese Patent Application No. 2010-253751, filed Nov. 12, 2010, the contents of which are incorporated herein by reference.

TECHNICAL FIELD

The present invention relates to a mixing circuit.

BACKGROUND ART

The mixing circuit electrically combines several series of signals to generate a single series of signals. As a document describing a general mixing circuit, an example is non-Patent Document 1.

FIG. 6 is a circuit diagram of showing a mixing circuit described in non-Patent Document 1. The mixing circuit described in FIG. 6 is composed of an output voltage signal generator 801, a frequency converter 802, an input unit 803, and a local oscillation signal generating circuit 5. The input unit 803 has an impedance matching circuit 2, and a signal output from a voltage signal source 9 is input through a signal source output impedance element 1 having an impedance value Z into the source of a grounded-gate MOS transistor M1 and the gate of a grounded-source MOS transistor M2. The gate of the grounded-gate MOS transistor M1 and the gate of the grounded-source MOS transistor M2 are respectively biased to voltages Vb1 and Vb2, which are necessary for the MOS transistors M1 and M2 to each operate as a voltage-current converting element.

The drains of the grounded-gate MOS transistor M1 and the grounded-source MOS transistor M2 are connected to the sources of frequency converting MOS transistors M3 and M4, and M5 and M6, respectively. Local oscillation signals output from the local oscillation signal generating circuit 5 are input into the gates of the frequency converting MOS transistors M3 to M6.

The drains of the frequency converting MOS transistors M3 to M6 are connected to resistance elements 6 and 7 for current-voltage conversion. Connection points of the frequency converting MOS transistors M3 to M6 are output terminals 10a and 10b of the circuit shown in FIG. 6 (output voltages are indicated as differential voltage signals OUT+ and OUT−).

The above-described mixing circuit operates as follows. That is, in the input unit 803, an input signal $V_{in}$ applies a voltage from the voltage signal source 9 through the signal source output impedance element 1 and the impedance matching circuit 2 to a node 8. Such an applied voltage is converted into currents having reversed phases by the grounded-gate MOS transistor M1 and the grounded-source MOS transistor M2, respectively. With such an operation, since a single-ended voltage signal is converted into a differential current signal, the input unit 803 corresponds to a single ended-differential signal converter.

The current generated by the input unit 803 is multiplied by the local oscillation signal generated by the local oscillation signal generating circuit 5 through the frequency converting MOS transistors M3, M4, M5, and M6, and then its frequency is converted to be current signals. The current signals are converted to voltage signals by the resistance elements 6 and 7, and are output from the output terminals 10a and 10b as the differential voltage signals OUT+ and OUT−.

It is to be noted that, however, when the frequency converting MOS transistors M3, M4, M5, and M6 each operate as an ideal switch, a non-linear component of the circuit shown in FIG. 6 is represented as follows. Specifically, according to the non-Patent Document 1, in order to calculate the non-linear component of the circuit, $V_{gs}$–$I_{ds}$ characteristics of a single unit of the MOS transistor are approximated as Expression (1). In addition, FIG. 7 shows the $V_{gs}$ of a single unit of the MOS transistor.

$$I_{ds} = gm1 \times V_{gs} + gm3 \times V_{gs}^3 \qquad \text{Expression (1)}$$

In the above Expression (1), $I_{ds}$ denotes drain current (variation from DC bias), $V_{gs}$ denotes gate-source current (variation from DC bias), gm1 denotes first transconductance, and gm3 denotes third transconductance. In Expression (1), $gm3 \times V_{gs}^3$ is a factor for generating a non-linear component.

Further, the input signal $V_{in}$ is represented as Expression (2).

$$V_{in} = A \times \cos(\omega_{in} \times t) \qquad \text{Expression (2)}$$

In the above Expression (2), A denotes amplitude of the input signal $V_{in}$, and $\omega_{in}$ denotes frequency of the input signal $V_{in}$.

By use of the above Expression (1) and Expression (2), the calculation of the drain current of the grounded-gate MOS transistor M1 results in Expression (3).

$$I_{ds}\_M1 = -(1/2) \times gm1\_M1 \times V_{in} - (1/16) \times gm3\_M1 \times V_{in}^3 \qquad \text{Expression (3)}$$

In Expression (3), $I_{ds}\_M1$ denotes the drain current of the grounded-gate MOS transistor M1, gm1_M1 denotes the first transconductance of the grounded-gate MOS transistor M1, and gm3_M1 denotes the third transconductance of the grounded-gate MOS transistor M1.

Likewise, the calculation of the drain current of the grounded-source MOS transistor M2 results in Expression (4).

$$I_{ds}\_M2 = (1/2) \times gm1\_M2 \times V_{in} + (1/8) \times gm3\_M2 \times V_{in}^3 - (1/16) \times (gm1\_M2/gm1\_M1) \times gm3\_M2 \times V_{in}^3 \qquad \text{Expression (4)}$$

In Expression (4), $I_{ds}\_M2$ denotes the drain current of the grounded-source MOS transistor M2, gm1_M2 denotes the first transconductance of the grounded-source MOS transistor M2, and gm3_M2 denotes the third transconductance of the grounded-source MOS transistor M2.

Here, the local oscillation signal VL0 to be input into the mixing circuit from the local oscillation signal generating circuit 5 is defined by Expression (5).

$$V_{LO} = A_{LO} \times \cos(\omega_{LO} \times t) \qquad \text{Expression (5)}$$

In Expression (5), $A_{LO}$ denotes the amplitude of the local oscillation signal, and $\omega_{LO}$ denotes the frequency of the local oscillation signal. The calculation of the differential output signal $V_{out\_diff}$ ((OUT+)−(OUT−)) of the mixing circuit in FIG. 6 results in Expression (6).

$$V_{out\_diff} = (gm1\_M2 + gm1\_M1) \times (1/2) \times G_{c1} \times R \times A \times V_a + [(1/8) \times gm3\_M2 - (1/16) \times (gm1\_M2/gm1\_M1) \times gm3\_M2 + (1/16) \times gm3\_M1] \times G_{c1} \times R \times A^3 \times V_b \qquad \text{Expression (6)}$$

In Expression (6), $V_a$ and $V_b$ are represented as follows.

$$V_a \approx (1/2) \times \cos[(\omega_{in} \pm \omega_{LO}) \times t] \qquad \text{Expression (6)-1}$$

$$V_b \approx (1/4) \times \cos[3 \times (\omega_{in} \pm \omega_{LO}) \times t] \qquad \text{Expression (6)-2}$$

In Expression (6), $G_{c1}$ denotes a conversion loss of the frequency in the frequency converting operation, and R is a resistance value of a load resistance for current-voltage conversion (resistance elements 6 and 7 in FIG. 6). In addition, the first term in Expression (6) represents an output signal component, and the second term thereof represents an output non-linear component. That is, the non-linear component of the mixing circuit shown in FIG. 6 is represented as the second term of Expression (6).

Next, the non-linear component calculated as described above will be analyzed. In a case where the grounded-gate MOS transistor M1 of the mixing circuit and the grounded-source MOS transistor M2 shown in FIG. 6 have an identical size (channel length and channel width) and an identical bias voltage is applied thereto, the transconductance of the grounded-gate MOS transistor M1 is same with that of the grounded-source MOS transistor M2. Therefore, the following Expression (7) and Expression (8) are satisfied.

$$gm1\_M1=gm1\_M2 \qquad \text{Expression (7)}$$

$$gm3\_M1=gm3\_M2 \qquad \text{Expression (8)}$$

When Expression (7) and Expression (8) are substituted into the second term of Expression (6), the following Expression (9) and Expression (10) in Expression (6) are same and cancel each other.

$$-(\tfrac{1}{16})\times(gm1\_M2/gm1\_M1)\times gm3\_M2 \qquad \text{Expression (9)}$$

$$(\tfrac{1}{16})\times gm3\_M1 \qquad \text{Expression (10)}$$

Accordingly, the non-linear component (Non_Linear1) of the mixing circuit shown in FIG. 6 is represented as the following Expression (11). In Expression (11), the non-linear component (gm3_M2) of the grounded-source MOS transistor M2 is dominant.

$$Non\_Linear1=(\tfrac{1}{8})\times gm3\_M2\times G_{c1}\times R\times V_b \qquad \text{Expression (11)}$$

Therefore, the description heretofore demonstrates that the linearity of the grounded-source MOS transistor M2 needs to be improved in order to decrease the non-linear component of the mixing circuit shown in FIG. 6.

PRIOR ART DOCUMENT

Non-Patent Document

Non-Patent Document 1: Blaakmeer, S. C. Klumperink, E. Leenaerts, D. M. W. Nauta, B. IC Design group, Univ. of Twente, Enschede, Netherlands. The BLIXER, a Wideband Balun-LNA-I/Q-Mixer Topology. IEEE JOURNAL OF SOLID-STATE CIRCUITS, VOL. 43.NO. 12, DECEMBER 2008, page 2706-2715.

SUMMARY OF THE INVENTION

Problem to be Solved

According to Expression (11), it is understood that gm3_M2 should be made smaller to decrease the non-linear component of the mixing circuit shown in FIG. 6. For this end, it is necessary to set high the voltage $V_{gs}$ between the gate and source of the grounded-gate MOS transistor M1 and the grounded-source MOS transistor M2. However, the input/output gain of the mixing circuit shown in FIG. 6 is determined by Expression (12).

$$V_{out\_dif}/V_{in}\approx(gm\_M2+gm\_M1)\times G_{c1}\times R\times\tfrac{1}{2} \qquad \text{Expression (12)}$$

In order to stabilize the input/output gain indicated by Expression (12), a relatively high gate voltage has to be applied to the grounded-gate MOS transistor M1 and the grounded-source MOS transistor M2. Therefore, in general, there is a demand of suppressing the power consumption in the mixing circuit. In the conventional mixing circuit shown in FIG. 6, however, the consumption current is further increased to decrease the non-linear component.

The present invention has been made in view of the above circumstances, and has an object of providing a mixing circuit in which an increase in the consumption current is suppressed while decreasing the non-linear component.

Solution to the Problem

In order to solve the above problem, according to an aspect of the present invention, there is provided a mixing circuit comprising: an input unit (for example, an input unit 803 illustrated in FIG. 1 and an input unit 303 illustrated in FIG. 3 and FIG. 5) including a first MOS transistor of a grounded-gate type with a source into which an input signal is input (for example, a grounded-gate MOS transistor M1 illustrated in FIG. 1, FIG. 3, and FIG. 5), and a second MOS transistor of a grounded-source type with a gate into which the input signal is input (for example, a grounded-source MOS transistor M2 illustrated in FIG. 1 to FIG. 5); a frequency converter (for example, a frequency converter 802 illustrated in FIG. 1, FIG. 3, and FIG. 5) for converting frequencies of a first current signal output from a drain of the first MOS transistor and a second current signal output from a drain of the second MOS transistor, based upon a local oscillation signal, and for generating a third current signal and a fourth current signal; and a voltage signal generator including a first load element for receiving the third current signal to convert into a first output voltage signal, and a second load element for receiving the fourth current signal to convert into a second output voltage signal, wherein the first load element is a third MOS transistor (for example, a load MOS converter M7 illustrated in FIG. 1, FIG. 3, and FIG. 5) with a gate and a drain connected, and the second load element is a fourth MOS transistor (for example, a load MOS converter M8 illustrated in FIG. 1, FIG. 3, and FIG. 5) with a gate and a drain connected.

In addition, in the mixing circuit according to an aspect of the present invention, preferably, the first MOS transistor, the second MOS transistor, the third MOS transistor, and the fourth MOS transistor are identical.

Furthermore, in the mixing circuit according to an aspect of the present invention, preferably, the frequency converter includes: a fifth MOS transistor and a sixth MOS transistor, each having a source to which the first current signal is supplied from the first MOS transistor, and a gate to which the local oscillation signal is supplied; and a seventh MOS transistor and an eighth MOS transistor, each having a source to which the second current signal is supplied from the second MOS transistor, and a gate to which the local oscillation signal is supplied.

Moreover, in the mixing circuit according to an aspect of the present invention, preferably, the output voltage signal generator includes: the third MOS transistor with a source to which the third current signal is supplied from the fifth MOS transistor and the seventh MOS transistor; the fourth MOS transistor with a source to which the fourth current signal is supplied from the sixth MOS transistor and the eighth MOS transistor, and the first output voltage signal is output from the source of the third MOS transistor, and the second output voltage signal is output from the source of the fourth MOS transistor.

Additionally, in the mixing circuit according to an aspect of the present invention, preferably, a first variable resistance element (for example, a variable resistance element 304 illustrated in FIG. 3 and FIG. 5) connected to the source of the third MOS transistor; and a second variable resistance element (for example, a variable resistance element 305 illustrated in FIG. 3 and FIG. 5) connected to the source of the fourth MOS transistor, the third current signal is input into the third MOS transistor through the first variable resistance element, and the fourth current signal is input into the fourth MOS transistor through the second variable resistance element.

Furthermore, the mixing circuit according to an aspect of the present invention, preferably, further comprise: a third variable resistance element (for example, a variable resistance element 306 illustrated in FIG. 3 and FIG. 5) connected to the source of the first MOS transistor; and a fourth variable resistance element (for example, a variable resistance element 307 illustrated in FIG. 3 and FIG. 5) connected to the source of the second MOS transistor.

Moreover, the mixing circuit according to an aspect of the present invention, preferably, the first variable resistance element, the second variable resistance element, the third MOS variable resistance element, and the fourth variable resistance element are identical in a channel length and a channel width.

In addition, preferably, a conversion loss of the frequency converter is substantially $2/\pi$.

Advantageous Effects of the Invention

According to the present invention, the insertion of a third MOS transistor and a fourth MOS transistor as resistance elements enables the non-linearity of the output to be small without increasing the gate-source voltage. Therefore, it is possible to provide a mixing circuit with a small non-linear component while suppressing the consumption current.

BRIEF DESCRIPTION OF THE DRAWINGS

FIG. 4 is a view illustrative of an effect of negative feedback of a variable resistance element according to an embodiment 2 of the present invention;

FIG. 7 is a view showing a single unit of MOS transistor.

DESCRIPTION OF EMBODIMENTS

Figure 1:
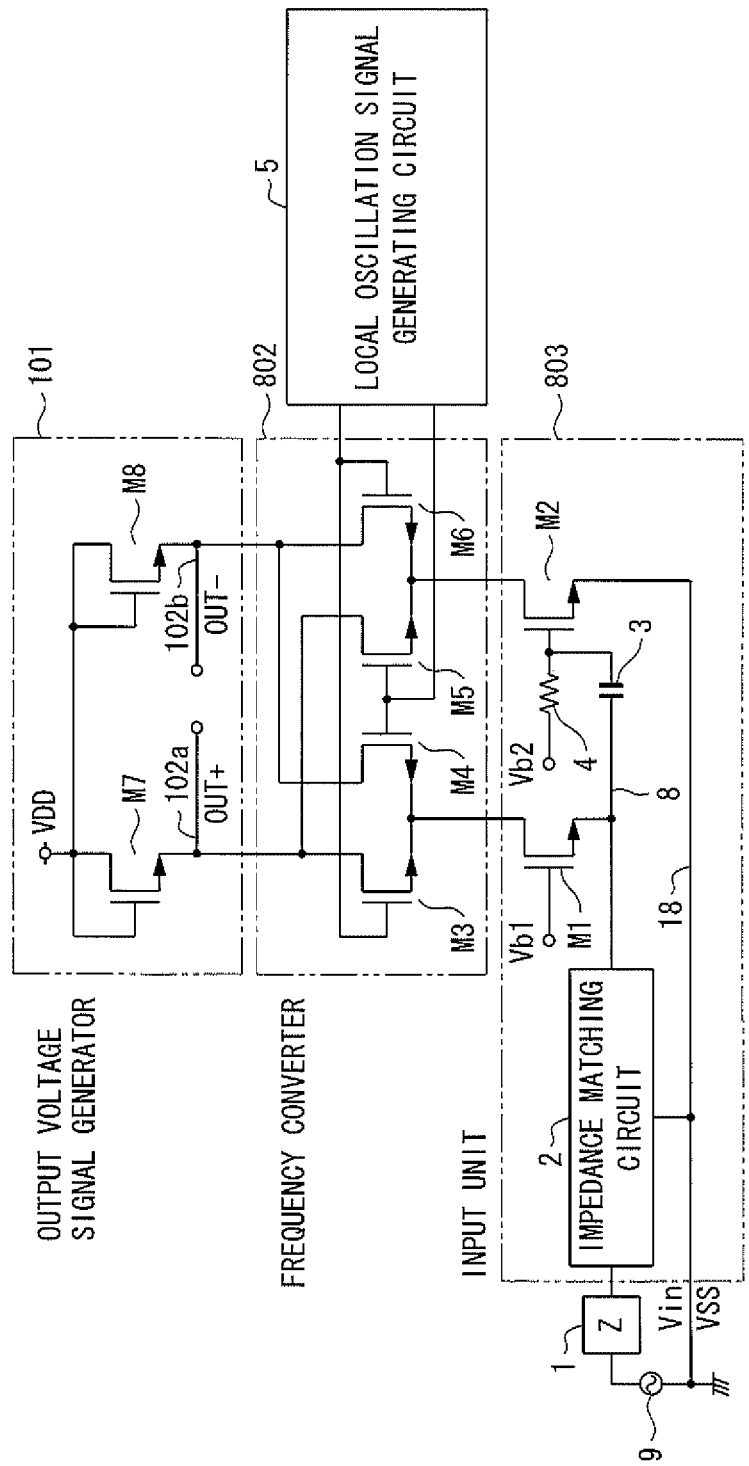
FIG. 1 is a view illustrative of a mixing circuit according to an embodiment 1 of the present invention.

Herein, mixing circuits according to embodiments 1 to 3 will be described.
(Embodiment 1)
Circuit Configuration FIG. 1 is a view illustrative of a mixing circuit according to an embodiment 1. The mixing circuit of the embodiment 1 includes: an output voltage signal generator 101; a frequency converter 802; an input unit 803; and a local oscillation signal generating circuit 5. Specifically, in FIG. 1, the same components and configurations as those employed in FIG. 6 have the same reference numerals.

The input unit 803 has an impedance matching circuit 2, and an input signal $V_{in}$ is input from a voltage signal source 9, connected to the ground voltage $V_{ss}$, into the impedance matching circuit 2. A signal source output impedance element 1 is provided on the output side of the voltage signal source 9. In addition, the input unit 803 includes: a grounded-gate MOS transistor M1 having the source to which the output terminal of the impedance matching circuit 2 is connected; and a grounded-source MOS transistor M2 having the gate terminal to which the output terminal of the impedance matching circuit 2 is connected. A capacitor 3 is arranged between the gate of the grounded-source MOS transistor M2 and the source of the grounded-gate MOS transistor M1.

The gate of the grounded-gate MOS transistor M1 and the gate of the grounded-source MOS transistor M2 are biased to each have an approximate DC voltage.

The frequency converter 802 is provided with four frequency converting MOS transistors M3 to M6. The sources of the frequency converting MOS transistors M3 and M4 are connected to the drain of the grounded-gate MOS transistor M1, and the sources of the frequency converting MOS transistors M5 and M6 are connected to the drain of the grounded-source MOS transistor M2.

The drain of the frequency converting MOS transistor M3 is connected to an output terminal 102a of the output voltage signal generator 101 and the drain of the frequency converting MOS transistor M5. In addition, the drain of the frequency converting MOS transistor M4 is connected to an output terminal 102b and the drain of the frequency converting MOS transistor M6, and the drain of the frequency converting MOS transistor M5 is connected to the output terminal 102a and the drain of the frequency converting MOS transistor M3. Furthermore, the drain of the frequency converting MOS transistor M6 is connected to the output terminals 102b and the drain of the frequency converting MOS transistor M4.

Moreover, the gates of the frequency converting MOS transistors M3 to M6 are connected to the output terminal of the local oscillation signal generating circuit 5 so that local oscillation signals are input into the gates thereof.

The output voltage signal generator 101 includes load MOS transistors M7 and M8. The source of the load MOS transistor M7 is connected to the drains of the frequency converting MOS transistors M3 and M5 of the frequency converter 802. In addition, the source of the load MOS transistor M8 is connected to the drains of the frequency converting MOS transistors M4 and M6 of the frequency converter 802. The output terminal 102a is arranged between the source of the load MOS transistor M7 and the drains of the frequency converting MOS transistors M3 and M5. The output terminal 102b is arranged between the source of the load MOS transistor M8 and the drains of the frequency converting MOS transistors M4 and M6.

The drains of the load MOS transistors M7 and M8 are connected to the power supply voltage $V_{DD}$. In addition, the gate and the drain of the load MOS transistor M7 and those of the load MOS transistor M8 are connected to each other.

Operations

Next, operations of the mixing circuit illustrated in FIG. 1 will be described.

The input unit 803 of the embodiment 1 functions as a single-ended differential signal converter. That is, an input signal $V_{in}$ is input from the voltage signal source 9 through the signal source output impedance element 1 and the impedance matching circuit 2 into a node 8. Such an input signal $V_{in}$ is converted into currents having reversed phases by the grounded-gate MOS transistor M1 and the grounded-source MOS transistor M2, respectively. With such an operation, the single-ended voltage signal is converted into a differential current signal.

The differential current signal is input into the sources of the frequency converting MOS transistors M3 to M6. The frequency converting MOS transistors M3 to M6 turn on or off in response to input of the location oscillation signals into the gates, and multiply the differential current signal and the local oscillation signal. With such an operation, the frequency of the differential current signal is converted.

In the output voltage signal generator 101, the differential current signals subjected to frequency conversion are converted to the voltage signals by the load MOS transistors M7 and M8. The voltage signals after conversion are output from the output terminals 102a and 102b as OUT+ and OUT−.

Non-Linear Component

Now, the non-linear component of the mixing circuit according to the embodiment 1 will be described.

In a case where the frequency converting MOS transistors M3 to M6 operate as ideal switches, the non-linear component of the mixing circuit illustrated in FIG. 1 is represented as follows. That is, when a differential output signal that is a difference between the differential voltage signals OUT+ and OUT− output from the output terminals 102a and 102b illustrated in FIG. 1 is calculated by use of Expression (3) and Expression (4), Expression (13) is satisfied.

$$V_{out\_dif} = (gm1\_m2 + gm1\_M1) \times (\tfrac{1}{2}) \times G_{c1} \times (1/gm1\_L) \times A \times Va + [(\tfrac{1}{8}) \times gm3\_M2 - (\tfrac{1}{16}) \times (gm1\_M2/gm1\_M1) \times gm3\_M2 + (\tfrac{1}{16}) \times gm3\_M1] \times G_{c1} \times (1/gm\_L) \times A^3 \times Vb - (gm\_M1^3 + gm1\_M2^3) \times (\tfrac{1}{8}) \times (gm3\_L/gm1\_L^4) \times G_{c1}^3 \times A^3 \times Vb$$   Expression (13)

In Expression (13), gm1_L denotes the first transconductance of the load MOS transistors M7 and M8, and gm3_L denotes the third transconductance of the load MOS transistors M7 and M8. Additionally, in Expression (13), the first term denotes an output signal component and the second and third terms denote an output non-linear component.

Next, an effect of decreasing the non-linear component in the mixing circuit of the embodiment 1 will be described. Assuming that the grounded-gate MOS transistor M1 and the grounded-source MOS transistor M2 illustrated in FIG. 1 are designed to have an identical size (channel length and channel width), and identical bias voltages Vb1 and Vb2 are applied. When Expression (7) and Expression (8) are substituted into the second and third terms in Expression (13), a non-linear component (Non_Linear2) of the mixing circuit of the embodiment 1 is represented as Expression (14).

$$\text{Non\_Linear2} = (\tfrac{1}{8}) \times gm3\_M2 \times G_{c1} \times (1/gm1\_L) \times A^3 \times Vb - (\tfrac{1}{4}) \times gm3\_L \times G_{c1}^3 \times [(gm1\_M1^3 + gm1\_M2^3)/gm1\_L4] \times A^3 \times Vb$$   Expression (14)

The first term of the non-linear component of the mixing circuit of the embodiment 1 represented as Expression (14) represents a non-linear component caused by the grounded-source MOS transistor M2. Additionally, the second term represents a non-linear component caused by the load MOS transistors M7 and M8. The first term and the second term have reversed phases. For this reason, in the embodiment 1, the non-linear component of the second term is cancelled by bringing the value of the second term close to the value of the first term, and decrease the non-linear component Non_Linear2. According to the mixing circuit of the embodiment 1 as described above, it is made possible to decrease the non-linear component than ever before without setting the gate-source voltage ($V_{gs}$) at a high value and without increasing the consumption current.

Figure 6:
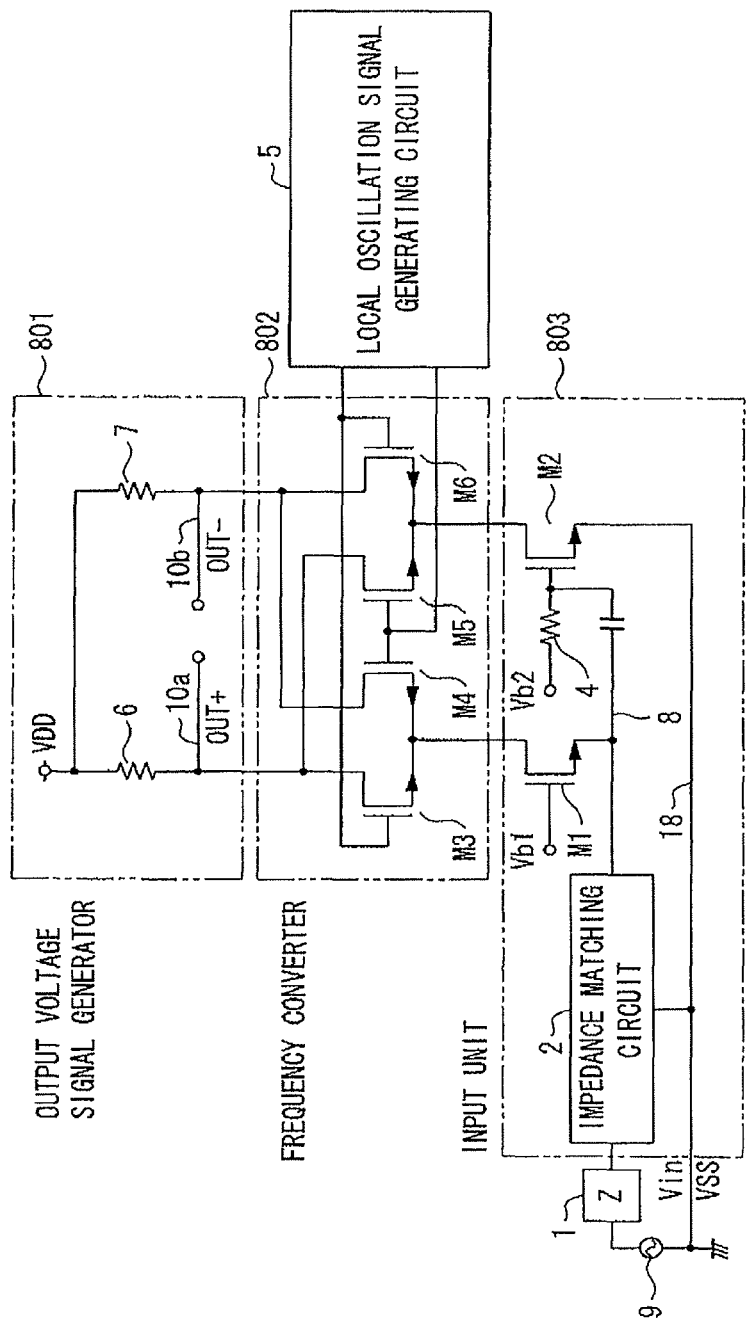
FIG. 6 is a view showing a mixing circuit described in non-Patent Document 1.

On the other hand, since the mixing circuit shown in FIG. 6 is not provided with the load MOS transistors M7 or M8, it is needless to say that there is no term corresponding to the second term in Expression (14) in the non-linear component of the conventional mixing circuit represented by Expression (11). Therefore, in the conventional mixing circuit, it is difficult to decrease the non-linear component in a similar way of the embodiment 1.

Next, the non-linear component of the mixing circuit shown in FIG. 6 and the non-linear component in the embodiment 1 will be calculated and compared concretely. Specifically, the grounded-gate MOS transistor M1, the grounded-source MOS transistor M2, and the load MOS transistors M7 and M8 in the mixing circuits illustrated in FIG. 1 and FIG. 6, are all assumed to have the same size. In addition, gm1 is the first transconductance of the MOS transistor, gm2 is the second transconductance thereof, and gm3 is the third transconductance thereof. Furthermore, in order to make the gains of both circuits equal, R=1/gm1 is satisfied and $G_{c1}$ is set to $2/\pi$.

As a calculation result under the above condition, the non-linear component Non_Linear1' of the mixing circuit shown in FIG. 6 and the non-linear component Non_Linear2' illustrated in FIG. 1 are obtained in Expression (15) and Expression (16).

$$\text{Non\_Linear1}' = (\tfrac{1}{8}) \times G_{c1} \times (gm3/gm1) A^3 \times Vb$$   Expression (15)

$$\text{Non\_Linear2}' = [(\tfrac{1}{8}) \times G_{c1} - (\tfrac{1}{4}) \times Gc1^3] \times (gm3/gm1) \times A^3 \times Vb$$   Expression (16)

A decreased amount of the non-linear component is indicated by the log of the ratio of Expression (15) to Expression (16) results in Expression (17).

$$20 \times \log(\text{Non\_Linear1}'/\text{Non\_Linear2}') = 20 \times \log(1/(1 - 2 \times Gc1^2)) \approx 14.5 \text{ dB}$$   Expression (17)

As described above, according to the mixing circuit of the embodiment 1, it is possible to decrease the non-linear component by approximately 14.5 dB from the conventional mixing circuit shown in FIG. 6 without increasing the consumption current.

Figure 2:
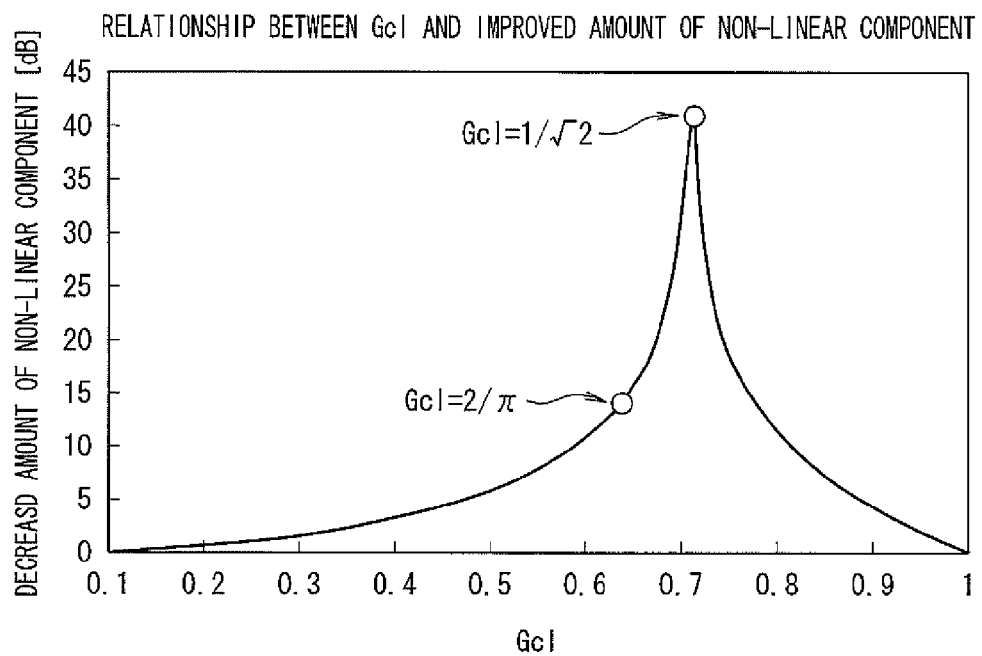
FIG. 2 is a view illustrative of the relationship between a conversion loss and a decreased amount of non-linear component of the mixing circuit according to the embodiment 1 of the present invention.

FIG. 2 is a view illustrative of the relationship between a conversion loss $G_{c1}$ of the mixing circuit according to the embodiment 1 and the decreased amount of the non-linear component, and the horizontal axis indicates the conversion loss $G_{c1}$ and the vertical axis indicates the decreased amount of the non-linear component. As is obvious from the drawing, the effect of decreasing the non-linear component in the embodiment 1 depends on the value of the conversion loss $G_{c1}$, and the effect is the highest when $G_{c1} = 1/\sqrt{2}$ is satisfied.

The conversion loss $G_{c1}$ in the embodiment 1 occurs at the frequency converter 802, and a value relatively close to $1/\sqrt{2}$ ($2/\pi$) is obtainable in an ideal frequency converting circuit. It is therefore possible to achieve a high effect of decreasing the non-linear component in the mixing circuit according to the embodiment 1.

(Embodiment 2)

Next, an embodiment 2 of the present invention will be described.

Figure 3:
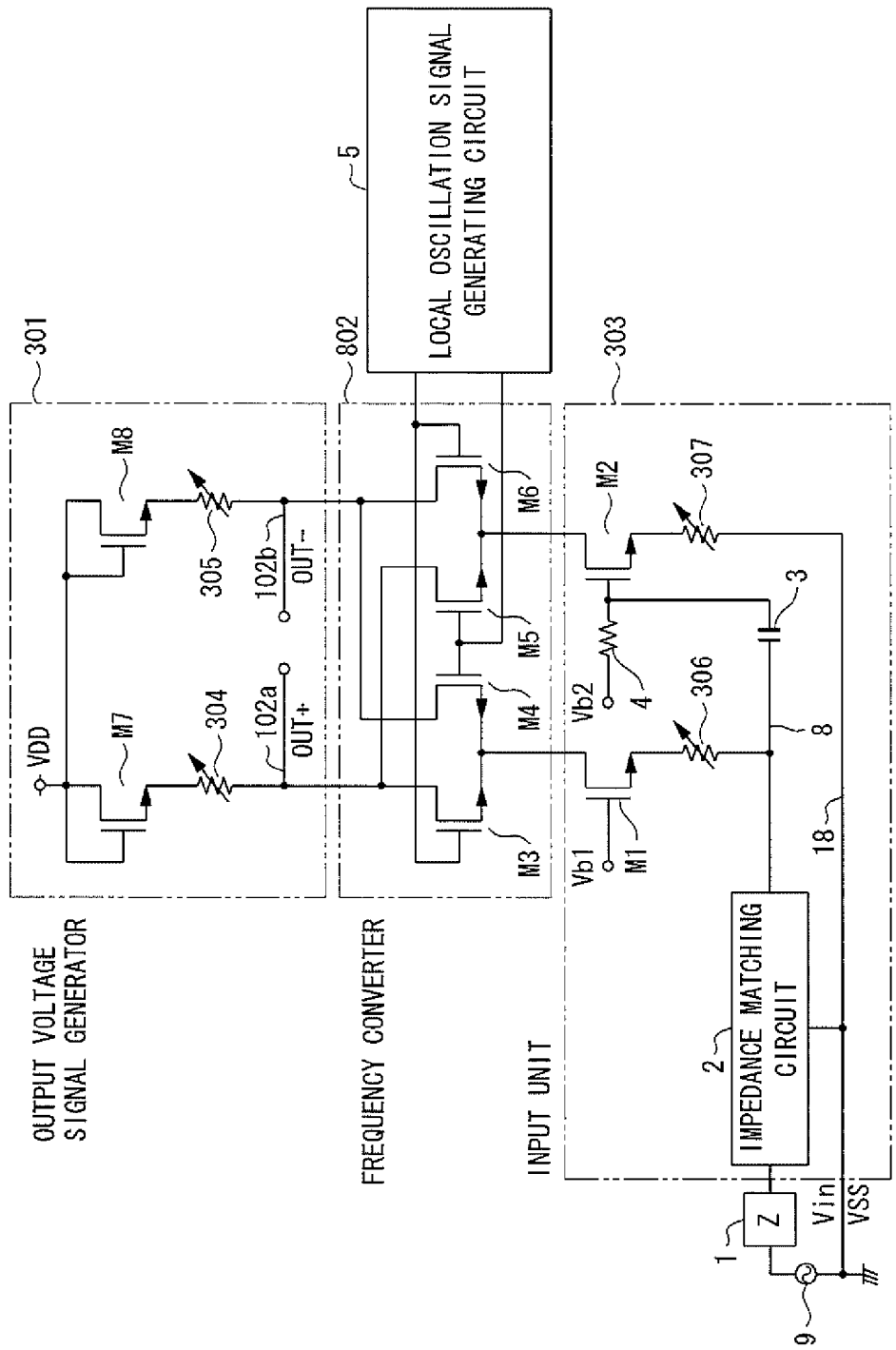
FIG. 3 is a view illustrative of a mixing circuit according to an embodiment 2 of the present invention.

FIG. 3 is a view illustrative of a mixing circuit of the embodiment 2. In FIG. 3, the same components and configurations as those employed in FIG. 1 have the same reference numerals, and the descriptions thereof will be partially omitted. The mixing circuit illustrated in FIG. 3 is composed of: the output voltage signal generator 301; a frequency converter 802; and the input unit 303. In the circuit, the frequency converter 802 has the same configuration as that of the frequency converter illustrated in FIG. 1, and local oscillation signals are input into the gates of the frequency converting MOS transistors M3 to M6.

In the mixing circuit according to the embodiment 2, a variable resistance element 306 is connected to the source of the grounded-gate MOS transistor M1, and a variable resistance element 307 is connected to the source of the grounded-source MOS transistor M2. The input signal $V_{in}$ is input through the variable resistance elements 306 and 307 into the grounded-gate MOS transistor M1 and the grounded-source MOS transistor M2, respectively.

In addition, in the mixing circuit according to the embodiment 2, a variable resistance element 304 is connected to the source of the load MOS transistor M7, and a variable resistance element 305 is connected to the source of the load MOS transistor M8. The differential voltage signal OUT+ generated through the load MOS transistor M7 and the variable resistance element 304 is output from the output terminal 102a. Furthermore, the differential voltage signal OUT- generated through the load MOS transistor M8 and the variable resistance element 305 is output from the output terminal 102b.

According to the embodiment 2 as described above, as illustrated in FIG. 4, the non-linear component can be decreased more than that of a single unit of MOS transistor shown in FIG. 7 by the negative feedback effect of the resistance value R of the variable resistance element. Therefore, in the embodiment 2, the non-linear component of the entire mixing circuit can be decreased more than that of the above-described embodiment 1.

Specifically, in the embodiment 2, the resistance values of the variable resistance elements 304 to 307 are configured to have the same value. In order to make the resistance values of the variable resistance elements 304 to 307 all the same, their design values and manufacturing conditions should be set all the same. This makes it possible to suppress the influence of the manufacturing fluctuations and temperature characteristic fluctuations of the variable resistance elements 304 to 307. Moreover, even with the use of the variable resistance elements 304 to 307 having different characteristics, the effect of improving the linearity of the mixing circuit is obtainable.

(Embodiment 3)

Next, an embodiment 3 will be described.

Figure 5:
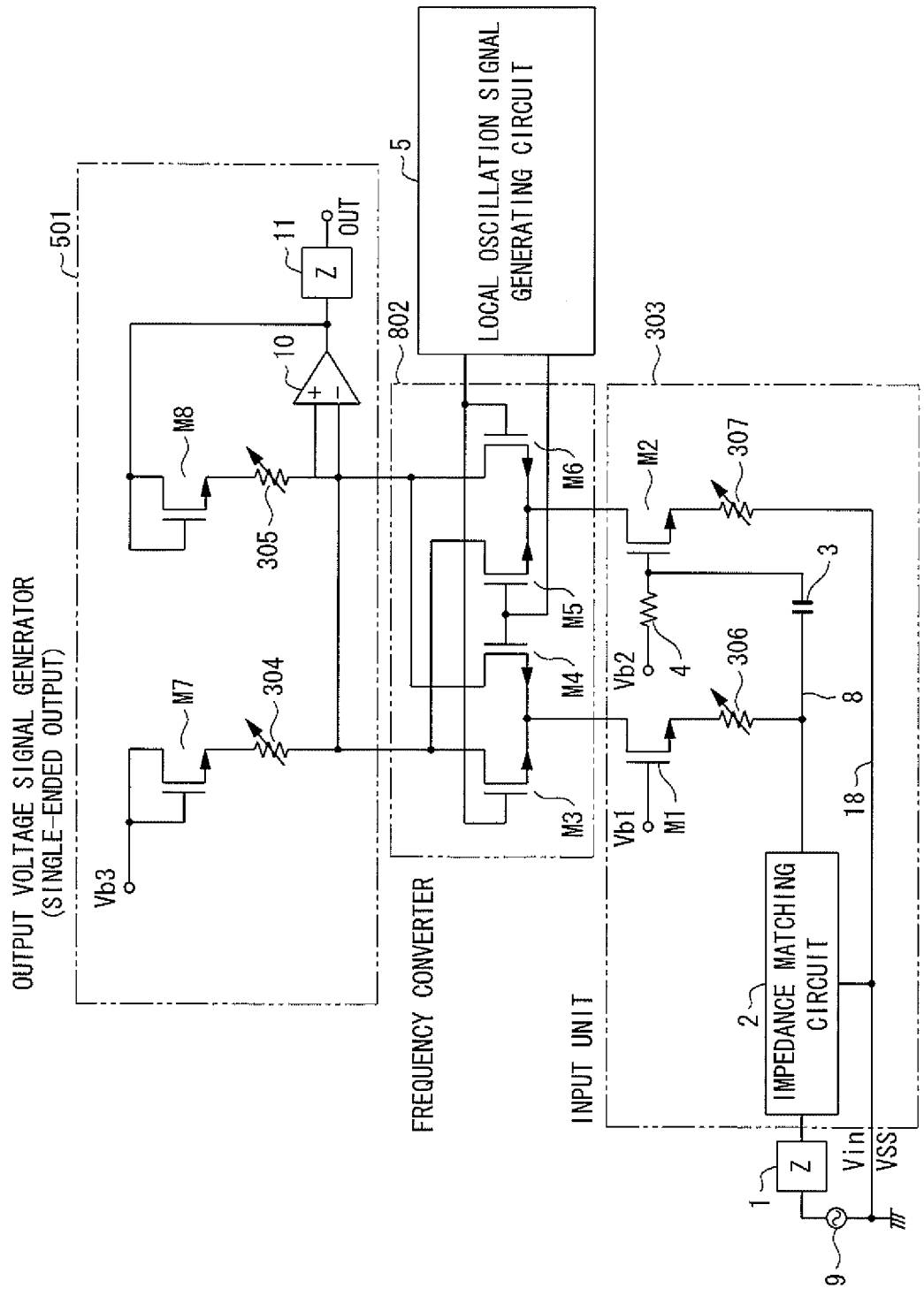
FIG. 5 is a view illustrative of a mixing circuit according to an embodiment 3 of the present invention.

FIG. 5 is a view illustrative of a mixing circuit according to the embodiment 3. In FIG. 5, the same components and configurations as those employed in FIG. 1 and FIG. 3 have the same reference numerals, and the descriptions thereof will be partially omitted. The mixing circuit illustrated in FIG. 5 is composed of an output voltage signal generator 501, a frequency converter 802, and the input unit 303. In the mixing circuit, the frequency converter 802 has the same configuration as that of the frequency converter illustrated in FIG. 1, and the local oscillation signals are input into the gates of the frequency converting MOS transistors M3 to M6. The input unit 303 is configured in the same way as that of the input unit 303 illustrated in FIG. 3 according to the embodiment 2.

In the output voltage signal generator 501, the variable resistance element 304 is connected to the source of the load MOS transistor M7, and the variable resistance element 305 is connected to the source of the load MOS transistor M8. In addition, the output voltage signal generator 501 is further provided with: an amplifier 10 having the inverting input terminal connected through the variable resistance element 304 to the source of the load MOS transistor M7, and the non-inverting input terminal connected through the variable resistance element 305 to the source of the load MOS transistor M8; and an impedance element 11 connected to the output terminal of the amplifier 10.

In the mixing circuit according to the above-described embodiment 3, it is possible to convert the output signal into single-ended ones, while maintaining the effect of decreasing the non-linear component obtainable in the embodiment 1 and the embodiment 2.

Industrial Availability

The mixing circuit according to the present invention is suitable for portable radio equipment, because the non-linear component is decreased and the power consumption is small.

Reference Signs List

| | |
|---|---|
| 1 | signal source output impedance element |
| 2 | impedance matching circuit |
| 3 | capacitor |
| 4 | resistance element |
| 5 | local oscillation signal generating circuit |
| 8 | node |
| 9 | voltage signal source |
| 10 | amplifier |
| 11 | impedance element |
| 101, 301, 501 | output voltage signal generator |
| 102a, 102b | output terminal |
| 303, 803 | input unit |
| 304-307 | variable resistance element |
| 802 | frequency converter |

The invention claimed is:

1. A mixing circuit comprising:
   an input unit including a first MOS transistor of a grounded-gate type with a source into which an input signal is input, and a second MOS transistor of a grounded-source type with a gate into which the input signal is input;
   a frequency converter for converting frequencies of a first current signal output from a drain of the first MOS transistor and a second current signal output from a drain of the second MOS transistor, based upon a local oscillation signal to generate a third current signal and a fourth current signal; and
   an output voltage signal generator including a first load element for receiving the third current signal to convert into a first output voltage signal, and a second load element for receiving the fourth current signal to convert into a second output voltage signal,
   wherein the first load element is a third MOS transistor with a gate and a drain connected, and the second load element is a fourth MOS transistor with a gate and a drain connected, and
   wherein the first MOS transistor, the second MOS transistor, the third MOS transistor, and the fourth MOS transistor are identical in a channel length and a channel width, and
   wherein the first MOS transistor, the second MOS transistor, the third MOS transistor, and the fourth MOS transistor have an identical conductivity type.

2. The mixing circuit according to claim 1, wherein the frequency converter includes:
   a fifth MOS transistor and a sixth MOS transistor, each having a source to which the first current signal is supplied from the first MOS transistor, and a gate to which the local oscillation signal is supplied; and
   a seventh MOS transistor and an eighth MOS transistor, each having a source to which the second current signal is supplied from the second MOS transistor, and a gate to which the local oscillation signal is supplied.

3. The mixing circuit according to claim 2,
   wherein the output voltage signal generator includes:
   the third MOS transistor with a source to which the third current signal is supplied from the fifth MOS transistor and the seventh MOS transistor;

the fourth MOS transistor with a source to which the fourth current signal is supplied from the sixth MOS transistor and the eighth MOS transistor, and wherein the first output voltage signal is output from the source of the third MOS transistor, and the second output voltage signal is output from the source of the fourth MOS transistor.

4. A mixing circuit comprising:

an input unit including a first MOS transistor of a grounded-gate type with a source into which an input signal is input, and a second MOS transistor of a grounded-source type with a gate into which the input signal is input;

a frequency converter for converting frequencies of a first current signal output from a drain of the first MOS transistor and a second current signal output from a drain of the second MOS transistor, based upon a local oscillation signal to generate a third current signal and a fourth current signal; and an output voltage signal generator including a first load element for receiving the third current signal to convert into a first output voltage signal, and a second load element for receiving the fourth current signal to convert into a second output voltage signal, wherein the first load element is a third MOS transistor with a gate and a drain connected, and the second load element is a fourth MOS transistor with a gate and a drain connected, and wherein the mixing circuit further comprises:

a first variable resistance element connected to the source of the third MOS transistor; and a second variable resistance element connected to the source of the fourth MOS transistor, wherein the third current signal is input into the third MOS transistor through the first variable resistance element, and wherein the fourth current signal is input into the fourth MOS transistor through the second variable resistance element.

5. The mixing circuit according to claim 4, further comprising:

a third variable resistance element connected to the source of the first MOS transistor; and a fourth variable resistance element connected to the source of the second MOS transistor.

6. The mixing circuit according to claim 5, wherein a resistance values of the first variable resistance element, the second variable resistance element, the third variable resistance element, and the fourth variable resistance element are identical.

7. The mixing circuit according to claim 1, wherein a conversion loss of the frequency converter is substantially $2/\pi$.

* * * * *